(12) United States Patent
Amano et al.

(10) Patent No.: US 10,012,970 B2
(45) Date of Patent: Jul. 3, 2018

(54) BOARD PRODUCTION STATE MONITORING SYSTEM

(71) Applicant: FUJI MACHINE MFG. CO., LTD., Chiryu (JP)

(72) Inventors: Masafumi Amano, Okazaki (JP); Hirotake Esaki, Ichinomiya (JP); Mitsutaka Inagaki, Anjyo (JP); Ken Morikami, Chiryu (JP)

(73) Assignee: FUJI MACHINE MFG. CO., LTD., Chiryu (JP)

( * ) Notice: Subject to any disclaimer, the term of this patent is extended or adjusted under 35 U.S.C. 154(b) by 339 days.

(21) Appl. No.: 14/441,694

(22) PCT Filed: Nov. 13, 2012

(86) PCT No.: PCT/JP2012/079367
§ 371 (c)(1),
(2) Date: May 8, 2015

(87) PCT Pub. No.: WO2014/076755
PCT Pub. Date: May 22, 2014

(65) Prior Publication Data
US 2015/0286202 A1    Oct. 8, 2015

(51) Int. Cl.
*G05B 19/18*    (2006.01)
*G05B 19/042*    (2006.01)
(Continued)

(52) U.S. Cl.
CPC ........ *G05B 19/0428* (2013.01); *G05B 11/011* (2013.01); *H05K 13/08* (2013.01);
(Continued)

(58) Field of Classification Search
CPC .............................................. G05B 19/0428
(Continued)

(56) References Cited

U.S. PATENT DOCUMENTS 6,542,830 B1 * 4/2003 Mizuno .............. G01R 31/2894
257/E21.525
6,546,308 B2 * 4/2003 Takagi .................. G01N 21/94
348/126
(Continued)

FOREIGN PATENT DOCUMENTS

JP    2002 111299    4/2002
JP    2004-200224 A    7/2004
(Continued)

OTHER PUBLICATIONS

Tomita, Yasushi et al. JP2011077095(A), System, Method, and Program for Monitoring Facility, Apr. 14, 2011, Espacenet (English translation of Japanese document).*
(Continued)

*Primary Examiner* — Mohammad Ali
*Assistant Examiner* — Sheela S Rao
(74) *Attorney, Agent, or Firm* — Oblon, McClelland, Maier & Neustadt, L.L.P.

(57) ABSTRACT

A board production state monitoring system including a camera unit that is disposed in a board work machine which carries out predetermined work for a board, that images a progress of the work by using a moving image, and that outputs moving image data; a data operation unit that receives, stores, and displays the moving image data; a trigger factor detection unit that detects at least one of a change factor in which working conditions of the work are changed inside the board work machine and a sign of error occurrence which shows that a working error may occur in the work, as a trigger factor; and an imaging start device for causing the camera unit to start moving image capturing if the trigger factor detection unit detects the trigger factor, and for causing the data operation unit to temporarily store the moving image data, is provided.

10 Claims, 4 Drawing Sheets

(51) Int. Cl.
  *H05K 13/08* (2006.01)
  *G05B 11/01* (2006.01)
(52) U.S. Cl.
  CPC .............. *G05B 2219/24012* (2013.01); *G05B 2219/24015* (2013.01); *G05B 2219/24033* (2013.01)
(58) Field of Classification Search
  USPC ............................................ 700/56–59, 121
  See application file for complete search history.

(56) References Cited

U.S. PATENT DOCUMENTS

2010/0080676 A1* 4/2010 Niitani ..................... B23Q 7/04
 414/226.01
2011/0054675 A1* 3/2011 Kalbavi ................. B25J 9/0084
 700/230

FOREIGN PATENT DOCUMENTS

| JP | 2006-13120 A | 1/2006 |
| JP | 2008 098441 | 4/2008 |
| JP | 2011-77095 A | 4/2011 |
| JP | 2012-169394 A | 9/2012 |

OTHER PUBLICATIONS

International Search Report dated Dec. 18, 2012 in PCT/JP12/079367 filed Nov. 13, 2012.
Extended European Search Report dated Mar. 21, 2016 in Patent Application No. 12888232.1.

\* cited by examiner

BOARD PRODUCTION STATE MONITORING SYSTEM

TECHNICAL FIELD

The present disclosure relates to a system which monitors a board production process by being installed in a board work machine including a component mounting machine, and more particularly relates to a board production state monitoring system which employs a system for imaging a work progress by using a moving image.

BACKGROUND ART

Facilities for producing a multiple component-mounted board include a solder printer, a component mounting machine, a board inspection machine, a reflow machine, and the like. In general, a board production line is built by connecting these facilities to a board conveyance device. In a case of the component mounting machine among these facilities, an operator frequently wants to check a state inside the component mounting machine during mounting work. In order to meet this demand, a board production state monitoring system is used which images a component suction operation or a component mounting operation of a mounting nozzle by using a moving image or a still image, and which stores obtained image data. Then, when a produced board is abnormal or quality thereof becomes poor, the operator checks a work progress inside the component mounting machine in order to find causes or to consider a countermeasure by reproducing the stored image data. PTL 1 and PTL 2 disclose a technical example of the board production state monitoring system of this type.

According to a mounting component inspection method disclosed in PTL 1, an image is captured for a component suction operation and component mounting operation of a suction nozzle of a surface mounting machine (component mounting machine). Furthermore, according to Claim 4 of PTL 1, an image is searched for and displayed by disposing an image storage unit incorporated in the surface mounting machine or disposing an independently installed image storage unit so as to store image data. PTL 1 discloses that this method enables an operator to determine whether there is a problem in a suction process, there is a problem in a mounting process, or abnormality occurs due to a post-process, when a component mounting failure occurs.

In addition, according to PTL 2, in a component mounting method in which a suction nozzle is lowered so as to mount a held component on a mounting-targeted body, and then the suction nozzle is raised after releasing the held component, a component mounting operation is checked by capturing an image during a predetermined period and retrieving an image captured at a fixed time immediately before a mounting error is detected. PTL 2 discloses that this method enables an operator to accurately establish a countermeasure against errors by easily and appropriately analyzing the mounting error based on a lesser amount of the image data.

CITATION LIST

Patent Literature

PTL 1: JP-A-2008-98441
PTL 2: JP-A-2002-111299

SUMMARY

Technical Problem

Incidentally, as disclosed in PTL 1, according to the technique of imaging the component suction operation and the component mounting operation each time, it is easy to acquire the image data serving as a reference when the component mounting failure occurs. However, the image storage unit for storing the image data requires an external storage memory having large storage capacity. In particular, in order to store moving image data instead of still image data, larger storage capacity is required. Furthermore, there is a problem in that much labor and searching time are needed when the image data required later is searched.

On the other hand, as disclosed in PTL 2, according to the technique of storing the image data when the mounting error occurs, the storage capacity can be saved desirably. However, when the error occurs, only a work progress during the error occurrence can be checked. Therefore, it is not possible to check whether or not there is a minor sign of occurrence before the error occurs, and it is also not possible to check a state where the sign of occurrence results in the error. Accordingly, sufficient image data cannot necessarily be provided for an operator to find causes when the error occurs and to consider a preventive countermeasure for the future.

It is known empirically and statistically that a working error such as a component mounting error in the component mounting machine does not occur at random, but occurs due to a certain change factor in many cases. For example, as the change factor, the working error is likely to occur when the mounting nozzle is changed, when a component lot is changed, or immediately thereafter. In addition, the working error does not occur suddenly. A minor sign of error occurrence is first shown prior to the error occurrence, and the sign results in the working error in many cases. Accordingly, it is considered that a suitable time to image a work progress or an efficient method of storing the image data can be obtained by detecting the change factor and the sign of error occurrence.

The present disclosure is made in view of the above-described problem in the related art, and a solution to the problem is to provide a board production state monitoring system which can prevent a working error, which can save storage capacity of a memory device for storing moving image data, and which enables an operator to efficiently take a countermeasure when the working error occurs or when a sign of error occurrence thereof is shown.

Solution to Problem

In order to solve the above-described problem, a board production state monitoring system according to one embodiment of the disclosure includes a camera unit that is disposed in a board work machine which carries out predetermined work for a board, that images a progress of the work by using a moving image, and that outputs moving image data, a data operation unit that receives, stores, and displays the moving image data, a trigger factor detection unit that detects at least one of a change factor in which working conditions of the work are changed inside the board work machine and a sign of error occurrence which shows that a working error may occur in the work, as a trigger factor, and imaging start means for causing the camera unit to start moving image capturing if the trigger factor detection unit detects the trigger factor, and for causing the data operation unit to temporarily store the moving image data in units of a predetermined data length.

In another embodiment of the disclosure, the board production state monitoring system includes a working error detection unit that detects the working error, and data storage means for causing the data operation unit to store the moving image data in units of the predetermined data length at the time when the working error is detected, if the working error detection unit detects a working error.

In another embodiment of the disclosure, the board production state monitoring system includes error time display means for causing the data operation unit to display the moving image data in units of the predetermined data length at the time when the working error is detected, if the working error detection unit detects the working error.

In another embodiment of the disclosure, the board production state monitoring system includes imaging finish means for causing the camera unit to finish the moving image capturing and for causing the data operation unit to finish the temporary storage of the moving image data, after a predetermined time has elapsed from when the trigger factor detection unit detects the change factor, and after the sign of error occurrence which is detected by the trigger factor detection unit is no longer shown and the system restores a normal operation range.

In another embodiment of the disclosure, the imaging start means temporarily stores the moving image data in a buffer memory whose storage capacity is relatively small, and the data storage means stores the moving image data in an external storage memory whose storage capacity is relatively large.

In another embodiment of the disclosure, the board production state monitoring system includes a database unit that holds a factor candidate which is a factor candidate showing the sign of error occurrence, and a countermeasure candidate which is a countermeasure candidate eliminating the factor candidate, and sign time display means for causing the data operation unit to display the moving image data in units of the predetermined data length at the time when the sign of error occurrence is detected, if the trigger factor detection unit detects the sign of error occurrence, and for causing the database unit to display the factor candidate and the countermeasure candidate which are associated with the sign of error occurrence.

In another embodiment of the disclosure, the board work machine includes a component mounting machine including a board conveyance device which conveys a board into the component mounting machine along a conveyance passage, positions the board, and conveys the board out from the component mounting machine, a component supply device which has multiple component supply feeders equipped with a component supply reel for holding multiple components and supplies the component, and a component transfer device which has a mounting nozzle for sucking the component from the component supply device and mounting the component on the positioned board, and amounting head moving by holding the mounting nozzle. The camera unit is disposed in the component mounting machine, and outputs the moving image data by imaging at least one progress of the component suction and the component mounting of the mounting nozzle by using a moving image. The change factor includes any one of a factor in which any one of the component supply feeder, the mounting nozzle, and the mounting head is changed, a factor in which a component lot is changed by replacing the component supply reel, and a factor in which a predetermined operation time has elapsed in at least any one device among the board conveyance device, the component supply device, and the component transfer device. The sign of error occurrence includes any one of inaccurate suction when the mounting nozzle sucks the component, and inaccurate mounting when the mounting nozzle mounts the component.

In another embodiment of the disclosure, the board work machine includes a board appearance inspection machine which inspects a position and a posture of the component mounted on the board. As the trigger factor detection unit, the board appearance inspection machine detects the sign of error occurrence which causes inaccurate mounting of the component, and as the working error detection unit, the board appearance inspection machine detects the working error which causes the component not to be mounted or causes amounting accuracy error.

Advantageous Effects

In the board production state monitoring system according to one embodiment of the disclosure, the trigger factor detection unit detects at least one of the change factor in which working conditions of the work are changed and the sign of error occurrence which shows that the working error may occur, as the trigger factor. The imaging start means causes the camera unit to start the moving image capturing when the trigger factor is shown, and causes the data operation unit to temporarily store the moving image data in units of the predetermined data length. Here, relatively after the change factor is shown, the working error is likely to occur, and the sign of error occurrence is likely to result in the working error. That is, according to the present disclosure, even if the working error does not occur, a work progress is imaged by using a moving image at the time when it is assumed that the working error is likely to occur, thereby temporarily storing moving image data.

Therefore, an operator can prevent a working error from occurring by recognizing a risk of the working error occurrence in advance and taking a countermeasure if necessary. In addition, when the working error actually occurs, the operator can check a work progress before and after the working error by reproducing the moving image data, and thus can efficiently take the countermeasure. Furthermore, during a normal time when the trigger factor is not shown, the moving image is not captured. Accordingly, it is possible to save the storage capacity in the memory device for storing the moving image data. Therefore, it is possible to reduce costs for the device by simplifying a device configuration and a device operation.

According to another embodiment of the disclosure, if the working error detection unit detects the working error, the moving image data is stored at the time when the working error is detected. That is, the moving image data obtained when the important working error occurs is not temporarily stored, but is stored on a long-term basis. In this manner, the limited storage capacity of the memory device can be effectively utilized, and the moving image data obtained when the important working error occurs can be continuously accumulated. If all moving image data items are stored for every work as in the related art, there will be no unoccupied capacity of the memory device in a short period of time due to the moving image data obtained during many normal operations. Accordingly, it is inefficient to store all moving image data items. Furthermore, it is possible to compare the current occurrence state of the working error with the past occurrence state of the working error. Therefore, it is possible to efficiently take a countermeasure when the working error occurs.

According to another embodiment of the disclosure, if the working error detection unit detects the working error, the error time display means automatically displays the moving image data. Therefore, an operator can immediately check a work progress when the working error occurs, thereby enabling the operator to quickly and accurately take a countermeasure.

According to another embodiment of the disclosure, the moving image capturing is finished after a predetermined time has elapsed from when the change factor is shown, and after the sign of error occurrence is no longer shown and the system restores the normal operation range. In this manner, the moving image capturing during less important normal operations is not endlessly continued, thereby enabling the operator to efficiently use the memory device.

According to another embodiment of the disclosure, the moving image data is temporarily stored in the buffer memory whose storage capacity is relatively small, and the moving image data is stored in the external storage memory whose storage capacity is relatively large. In this way, two types of memory device are selectively used. Therefore, it is possible to improve cost performance by optimizing the device configuration.

According to another embodiment of the disclosure, the board production state monitoring system further includes the database unit that holds the factor candidate showing the sign of error occurrence, and the countermeasure candidate. The moving image data, the factor candidate, and the countermeasure candidate are displayed when the sign of error occurrence is shown. In this manner, when a minor sign of error occurrence is shown before the working error occurs, an operator can take a desirable countermeasure by referring to the factor candidate, the countermeasure candidate, and the moving image data. Accordingly, the operator can reliably prevent the sign of error occurrence from resulting in the working error.

According to another embodiment of the disclosure, the board work machine includes the component mounting machine. The camera unit is disposed in the component mounting machine, and images at least one progress of the component suction and the component mounting of the mounting nozzle by using the moving image. The present disclosure can be embodied in the component mounting machine. Therefore, advantageous effects according to the described embodiments can be significantly obtained in a case of the change factor and the sign of error occurrence in the component mounting machine.

According to another embodiment of the disclosure, the board work machine includes the board appearance inspection machine. The board appearance inspection machine detects the sign of error occurrence and the working error. The present disclosure can be embodied in a configuration in which the component mounting machine and the board appearance inspection machine are combined with each other. Therefore, advantageous effects according to the described embodiments can be significantly obtained.

DESCRIPTION OF EMBODIMENTS

Figure 1:
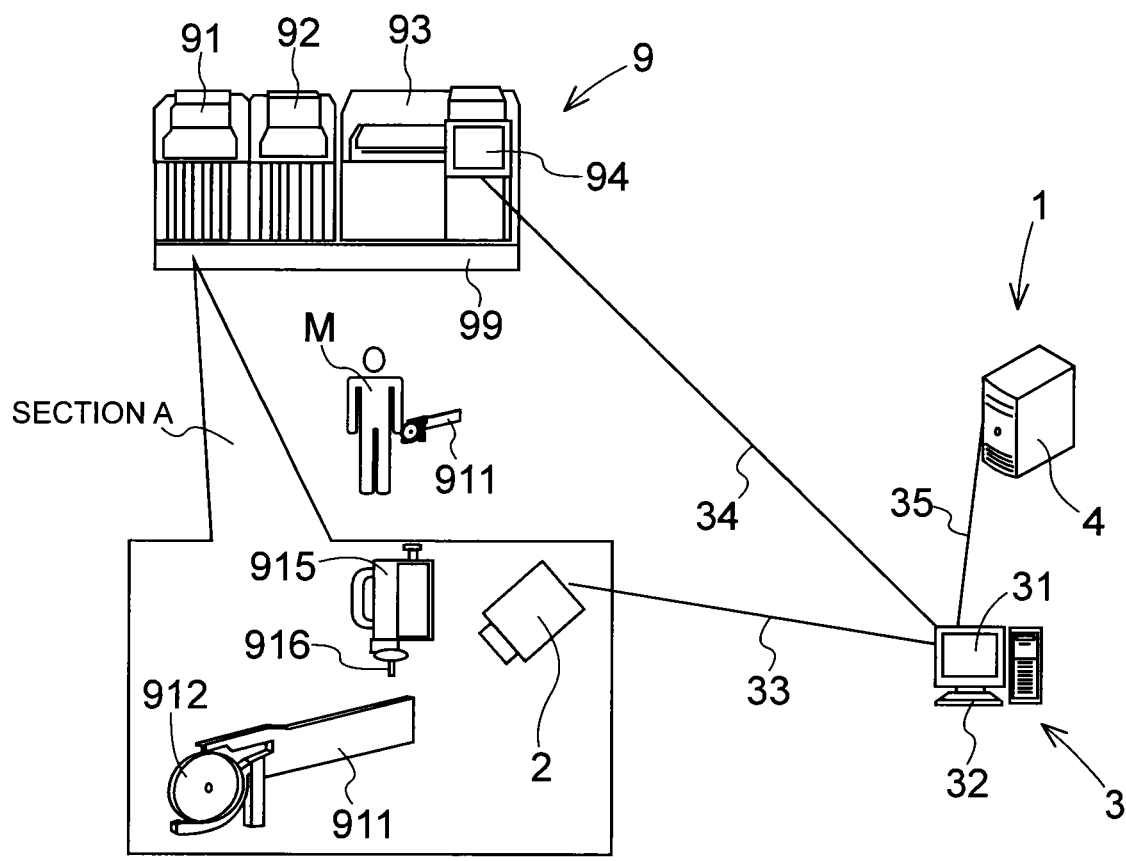
FIG. 1 is a configuration diagram illustrating a system configuration of a board production state monitoring system according to a first embodiment.

A board production state monitoring system 1 according to a first embodiment of the present disclosure will be described with reference to FIGS. 1 to 4. FIG. 1 is a configuration diagram illustrating a system configuration of the board production state monitoring system 1 according to the first embodiment. As illustrated, the board production state monitoring system 1 is installed in a board production line 9.

First, a configuration outline of the board production line 9 will be described. The board production line 9 is configured so that a component mounting machine 91, a board appearance inspection machine 92, and a reflow machine 93 are arrayed side by side on a common base 99, and are connected to one another by a board conveyance device (not illustrated). In addition, a host computer 94 is arranged on a front side of the reflow machine 93. Without being limited to the above-described configuration, the configuration of the board production line 9 may include a solder printer and a printing inspection machine. Alternatively, multiple component mounting machines may be arrayed side by side.

In addition to the above-described board conveyance device, the component mounting machine 91 has a component supply device, a component transfer device, and a component camera (all not illustrated). The board conveyance device conveys a board into the component mounting machine 91 along a conveyance passage, positions the board, and conveys the board out from the component mounting machine 91. The component supply device is a device using a feeder system, and is configured so that multiple component supply feeders 911 are arrayed side by side. A component supply reel 912 is rotatably mounted on the component supply feeder 911. The component supply reel 912 has a wound carrier tape which holds multiple components at a constant interval. The carrier tape is drawn out, and the components are sequentially supplied. Section A in FIG. 1 represents an enlarged section of an internal configuration of the component mounting machine 91, and illustrates one component supply feeder 911 as an example.

The component supply feeder 911 with the component supply reel 912 is replaced and changed by an operation of an operator M. In addition, in some cases, only the component supply reel 912 is replaced by the operation of the operator M. Replacing the component supply feeder 911 or the component supply reel 912 changes a component lot of a component to be supplied. A change of the component supply feeder 911 or the component supply reel 912 corresponds to a change factor according to the present invention.

The component transfer device is a so-called XY robot-type device, which is movable in directions of two axes orthogonal to each other. The component transfer device has a mounting head 915, which is driven in the directions of two axes orthogonal to each other by a two axis drive mechanism. The mounting head 915 holds one or more mounting nozzles 916 so as to be freely raised and lowered. The mounting nozzle 916 sucks the component from the component supply feeder 911 by using negative pressure, and mounts the component on a positioned board. Depending on a type or size of a mounting-targeted component, the mounting head 915 and the mounting nozzle 916 are changed. A change of the mounting head 915 and the mounting nozzle 916 corresponds to a change factor according to the present disclosure.

The component camera images a state when the mounting nozzle 916 of the component transfer device sucks the component. Based on obtained image data, the component camera determines a component suction state of the mounting nozzle 916. In other words, the component camera determines whether or not the component is sucked at a regular position and whether or not a posture of the component is correct. The component camera determines that a suction working error occurs when a component suction state of the mounting nozzle 916 is defective, and instructs the mounting nozzle 916 to discard the component. When the component is not sucked since the mounting nozzle 916 cannot suck the component, or when the mounting nozzle 916 drops the component in the middle of the component suction, as a matter of course, the component camera also determines that a working error occurs. In addition, the component camera determines that minor abnormality which is more insignificant than the suction working error is inaccurate suction. The inaccurate suction when the mounting nozzle 916 sucks the component corresponds to a sign of error occurrence according to the present disclosure.

In addition, operation time periods for the board conveyance device, the component supply device, and the component transfer device which configure the component mounting machine 91 are respectively managed. When a predetermined operation time period has elapsed, an operator frequently inspects and maintains these devices. Regardless of whether or not the inspection and the maintenance are carried out, the elapse of the predetermined operation time period is regarded as a change factor according to the first embodiment.

The board appearance inspection machine 92 is arranged on a post-process side of the component mounting machine 91, and inspects an appearance of the board. In detail, the board appearance inspection machine 92 inspects whether or not each component is accurately mounted on a designated mounting position on the board with a correct posture. The board appearance inspection machine 92 determines that a mounting working error occurs if the mounting position of the component is deviated by more than an allowable error or if the mounting posture is incorrect. When the component is not mounted, as a matter of course, the board appearance inspection machine 92 also determines that the working error occurs. In addition, the board appearance inspection machine 92 determines that minor abnormality which is more insignificant than the mounting working error is inaccurate mounting. The inaccurate mounting corresponds to a sign of error occurrence according to the present disclosure.

The reflow machine 93 is arranged on a post-process side of the board appearance inspection machine 92, and a board determined to be acceptable by the board appearance inspection machine 92 is conveyed into the reflow machine 93. The reflow machine 93 heats and re-melts solder paste between the board serving as a base material and the component, then cools, and solidifies the solder paste, thereby completely carrying out soldering work.

The host computer 94 is connected to the component mounting machine 91, the board appearance inspection machine 92, and the reflow machine 93 by using a communication line, and comprehensively manages a work progress of these machines 91 to 93. Information related to a change factor shown in the component mounting machine 91, a sign of error occurrence which indicates inaccurate suction of the component, and a working error such as a suction working error of the component is transmitted to the host computer 94. Similarly, information related to a sign of error occurrence which is shown in the board appearance inspection machine 92 and which indicates inaccurate mounting of the component, and a working error such as a mounting working error is also transmitted to the host computer 94.

Next, a configuration of the board production state monitoring system 1 will be described. As illustrated in FIG. 1, the board production state monitoring system 1 is configured to include a camera unit 2, a moving image storage computer 3, and an external storage memory 4. The camera unit 2 is arranged inside the component mounting machine 91. The moving image storage computer 3 and the external storage memory 4 can be arranged in the vicinity of the board production line 9 or inside a monitoring chamber away from the board production line 9. The arrangement is not particularly limited.

The camera unit 2 is incorporated in the component transfer device of the component mounting machine 91, and is moved with the mounting head 915 by a two axis drive mechanism. The camera unit 2 images a component suction progress and a component mounting progress of the mounting nozzle 916 by using a moving image, and outputs moving image data. Without being limited to the above-described configuration, the camera unit 2 may image only either the suction progress or the mounting progress. Alternatively, two stationary cameras may share imaging for the suction progress and the mounting progress with each other.

The moving image storage computer 3 is configured to include general hardware and dedicated software for monitoring a production state of the board. The hardware of the moving image storage computer 3 includes a CPU (not illustrated), a storage device, a display 31, a keyboard 32, and the like, but is not limited thereto. The moving image storage computer 3 is connected to the camera unit 2 by a communication line 33. The moving image storage computer 3 controls an imaging operation of the camera unit 2, and receives moving image data obtained by the imaging operation from the camera unit 2. The storage device of the moving image storage computer 3 can temporarily store the moving image data as a buffer memory. However, since storage capacity of the buffer memory is limited, the temporarily stored moving data items are deleted sequentially from an old item.

In addition, the moving image storage computer 3 is connected to the host computer 94 of the board production line 9 by a communication line 34. The moving image storage computer 3 receives information related to a change factor, a sign of error occurrence, and a working error from the host computer 94. The information may be received through communication at fixed time intervals. Alternatively, the information may be received through an occasional interruption process.

The external storage memory 4 is a storage device having storage capacity which is considerably larger than that of the buffer memory of the moving image storage computer 3. The external storage memory 4 is connected to the moving image storage computer 3 by a communication line 35. The external storage memory 4 is controlled by the moving image storage computer 3, and can store and read the transmitted moving image data. Unlike the buffer memory of the moving image storage computer 3, the external storage memory 4 does not have a problem of insufficient storage capacity even if the external storage memory 4 stores all transmitted moving image data.

A data operation unit, a trigger factor detection unit, imaging start means, a working error detection unit, data storage means, error time display means, and imaging finish means according to the present invention are realized by the software of the moving image storage computer 3.

The data operation unit receives the moving image data from the camera unit 2, stores and displays the moving image data. An actual role of the data operation unit is that the moving image storage computer 3 receives the moving image data from the camera unit 2 so as to temporarily store or save the moving image data in the storage device and to display the moving image data on the display 31. The specific storage destination, storage method, and display method of the moving image data are defined in detail in accordance with each means (to be described later).

The trigger factor detection unit detects a change factor in which working conditions are changed when the mounting nozzle 916 sucks and mounts the component inside the component mounting machine 91, and the sign of error occurrence which shows that the working error may occur in the suction work and the mounting work, as a trigger factor. An actual role of the trigger factor detection unit is that the moving image storage computer 3 receives the information related to the change factor and the sign of error occurrence from the host computer 94. The board production line 9 shares a partial function of the trigger factor detection unit.

If the trigger factor detection unit detects the trigger factor, the imaging start means causes the camera unit 2 to start moving image capturing, and causes the data operation unit to temporarily store the moving image data in units of a predetermined data length. An actual role of the imaging start means is that if the moving image storage computer 3 receives information related to the change factor and the sign of error occurrence from the host computer 94, the imaging start means issues a command to start imaging to the camera unit 2, and temporarily stores the moving image data received from the camera unit 2 in the buffer memory in units of a predetermined data length.

The error detection unit detects the working error. An actual role of the error detection unit is that the moving image storage computer 3 receives information related to an error factor from the host computer 94. The board production line 9 shares a partial function of the error detection unit.

If the working error detection unit detects the working error, the data storage means stores the moving image data in units of a predetermined data length in the data operation unit at the time when the working error is detected. An actual role of the data storage means is that if the moving image storage computer 3 receives information related to the working error from the host computer 94, the data storage means stores the moving image data received from the camera unit 2 in the external storage memory 4 in units of a predetermined data length.

If the working error detection unit detects the working error, the error time display means causes the data operation unit to display the moving image data in units of a predetermined data length at the time when the working error is detected. An actual role of the error time display means is that if the moving image storage computer 3 receives information related to the error factor from the host computer 94, the error time display means reads the moving image data from the buffer memory or the external storage memory 4, and displays the moving image data on the display 31.

The imaging finish means causes the camera unit 2 to finish the moving image capturing and causes the data operation unit to finish the temporary storage of the moving image data, after a predetermined time has elapsed from when the trigger factor detection unit detects the change factor, and after the sign of error occurrence which is detected by the trigger factor detection unit is no longer shown and the device restores a normal operation range. An actual role of the imaging finish means is to preset the predetermined time in the moving image storage computer 3, and to issue a command to finish the imaging to the camera unit 2 when information related to the error factor is not received in spite of the fact that a predetermined time has elapsed after information related to the change factor is received from the host computer 94. Furthermore, an actual role of the imaging finish means is to cause the camera unit 2 to continue the moving image capturing while the moving image storage computer 3 receives information related to the sign of error occurrence from the host computer 94, and to issue a command to finish the imaging to the camera unit 2 when the information related to the sign of error occurrence is no longer received.

Figure 2:
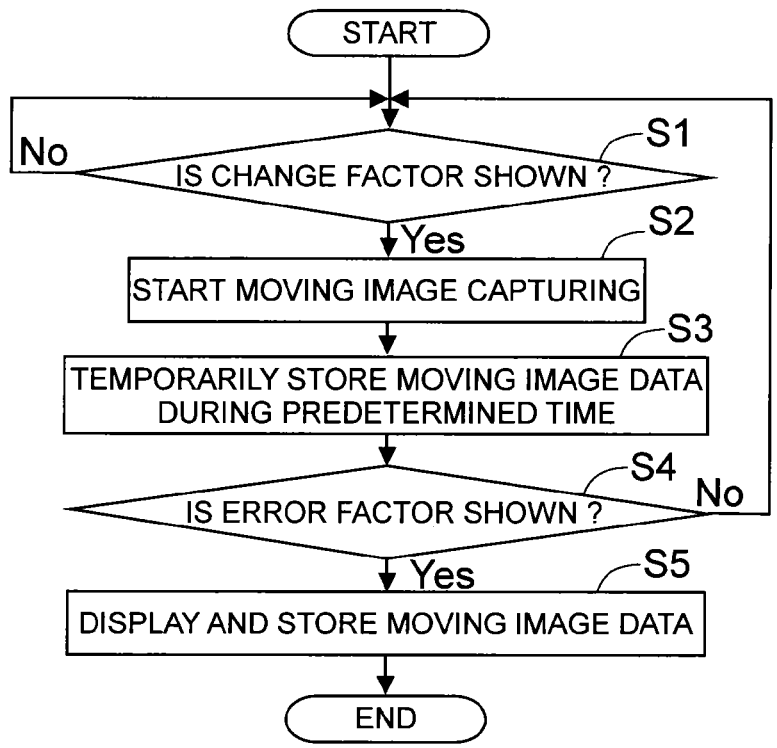
FIG. 2 is a flowchart illustrating operations when a change factor is shown in the system according to the first embodiment.
Figure 3:
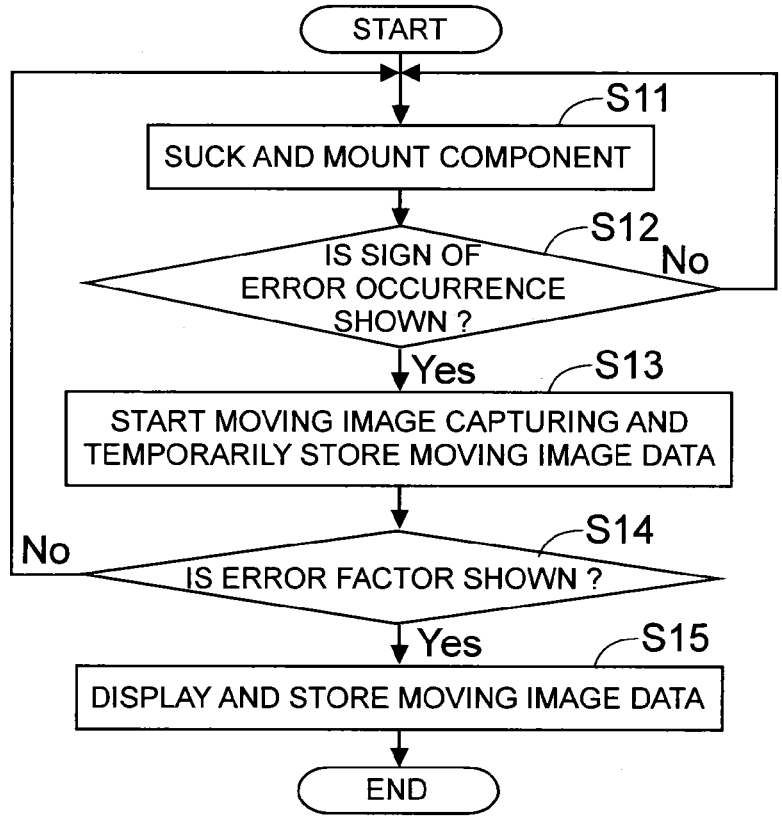
FIG. 3 is a flowchart illustrating operations when a sign of error occurrence is shown in the system according to the first embodiment.

Next, an operation of the board production state monitoring system 1 according to the first embodiment configured as described above will be described. FIG. 2 is a flowchart illustrating operations when a change factor is shown in the system 1 according to the first embodiment. In addition, FIG. 3 is a flowchart illustrating operations when a sign of error occurrence is shown in the system 1 according to the first embodiment. The flowcharts in FIGS. 2 and 3 are functional while the board production line 9 is operated.

In Step S1 of FIG. 2, the moving image storage computer 3 frequently checks whether or not information related to the change factor is received from the host computer 94. If the information related to the change factor is not received, the operation in Step S1 is repeated. If the information related to the change factor is received, the flow proceeds to Step S2. In Step S2, the moving image storage computer 3 causes the camera unit 2 to start the moving image capturing. Furthermore, in subsequent Step S3, the moving image storage computer 3 causes the buffer memory to temporarily store the moving image data obtained during a predetermined time.

Next, in Step S4, the moving image storage computer 3 investigates whether or not the information related to the error factor is received from the host computer 94. If the information related to the error factor is not received, the flow returns to Step S1. If received, the flow proceeds to Step S5. In Step S5, the moving image storage computer 3 causes the display 31 to display the moving image data obtained during the predetermined time, and stores the moving image data obtained during the predetermined time by transmitting the moving image data from the buffer memory to the external storage memory 4.

In addition, in Step S11 of FIG. 3, the component mounting machine 91 carries out component suction work and component mounting work. At this time, the host computer 94 recognizes the presence or absence of the sign of error occurrence. In subsequent Step S12, the moving image storage computer 3 frequently checks whether or not the information related to the sign of error occurrence is received from the host computer 94. If the information related to the sign of error occurrence is not received, the flow returns to Step S11. If the information related to the sign of error occurrence is received, the flow proceeds to Step S13. In Step S13, the moving image storage computer 3 causes the camera unit 2 to start the moving image capturing, and causes the buffer memory to temporarily store the further obtained moving image data.

Next, in Step S14, the moving image storage computer 3 investigates whether or not the information related to the error factor is received from the host computer 94. If the information related to the error factor is not received, the flow returns to Step S11. If received, the flow proceeds to Step S15. In Step S15, the moving image storage computer 3 causes the display 31 to display the moving image data, and stores the moving image data by transmitting the moving image data from the buffer memory to the external storage memory 4.

It is possible for an error factor to be unexpectedly shown without both a change factor and a sign of error occurrence being shown. In this case, the moving image storage computer 3 causes the camera unit 2 to immediately start the moving image capturing at the time when the information related to the error factor is received from the host computer 94. The moving image storage computer 3 causes the buffer memory to temporarily store the moving image data, and stores the moving image data by transmitting the moving image data to the external storage memory 4.

Figure 4:
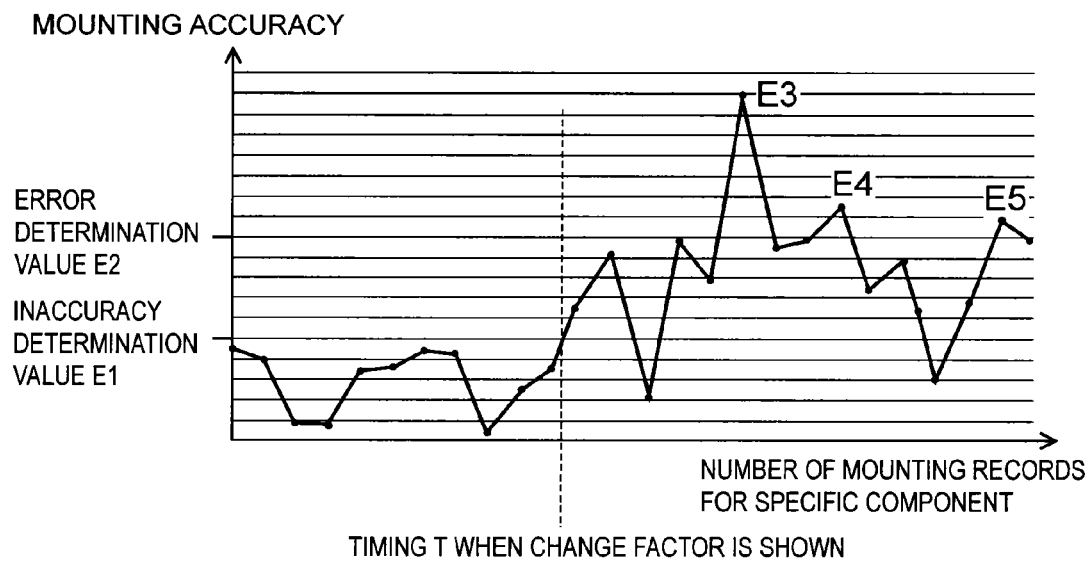
FIG. 4 is a view for schematically illustrating a monitoring function of the board production state monitoring system according to the first embodiment.

Next, FIG. 4 is a view for schematically illustrating a monitoring function of the board production state monitoring system 1 according to the first embodiment. In FIG. 4, the horizontal axis represents the number of mounting records for a specific component, and the vertical axis represents mounting accuracy of the specific component. Furthermore, timing T represents a change of the component supply feeder 911 which supplies the specific component, that is, the timing T represents the time when a change factor is shown. In addition, in the vertical axis direction, an inaccuracy determination value E1 for determining inaccurate mounting and an error determination value E2 for determining a mounting error are illustrated.

In an example illustrated in FIG. 4, the mounting accuracy of the specific component is smaller than the inaccuracy determination value E1, and thus is satisfactorily stabilized before the timing T when the change factor is shown. Accordingly, the moving image capturing is not performed by the camera unit 2. Then, if the component supply feeder 911 is changed at the timing T, the camera unit 2 starts the moving image capturing. The moving image data obtained during a predetermined time, for example, the moving image data for mounting records up to ten times is temporarily stored.

Here, if the mounting accuracy of the specific component is satisfactorily stabilized after the timing T when the change factor is shown, the moving image data up to ten times is less important. However, in the example illustrated in FIG. 4, the mounting accuracy of the specific component is variably unstable, and thus may exceed the inaccuracy determination value E1 and the error determination value E2 in some cases. Then, at the time when the mounting accuracy of the specific component exceeds the error determination value E2 and reaches a higher error value E3, it is determined as the error factor. Therefore, the moving image data for mounting records up to ten times before and after a highly important error factor is shown can be transferred from temporary storage to storage on a long-term basis. In addition, with regard to the error factor of the subsequent error values E4 and E5, the moving image data before and after the error factor is shown can also be stored on a long-term basis.

The monitoring function described referring to FIG. 4 is an example when the component supply feeder 911 is changed, and another method can be employed. For example, when the mounting head 915 or the mounting nozzle 916 is changed, it is preferable to monitor the suction accuracy, the inaccurate mounting, or the error for all components as a monitoring target without being limited to the specific component.

In the board production state monitoring system 1 according to the first embodiment, the camera unit 2 images the work progress by using the moving image when the trigger factor is assumed that the working error is likely to occur, that is, the change factor and the sign of error occurrence are shown, thereby temporarily storing the moving image data. Furthermore, at the time when the working error is detected, the moving image data obtained when the important working error occurs is not temporarily stored, but is stored on a long-term basis, and the data is accumulated. Therefore, an operator can prevent the working error from occurring by recognizing a risk of the working error occurrence in advance and taking a countermeasure if necessary. In addition, when the working error actually occurs, the moving image data is automatically displayed. Accordingly, the operator can check a work progress before and after the working error. In addition, the operator can compare the current working error with the past working error, and thus the operator can efficiently take a countermeasure.

Furthermore, the temporary storage using the buffer memory and the long-term storage using the external storage memory 4 are selectively used. In addition, during a normal time when the trigger factor is not shown, the camera unit 2 does not perform the moving image capturing. Therefore, storage capacity of the buffer memory and the external storage memory 4 for storing the moving image data can be saved and effectively utilized. In this manner, it is possible to reduce costs for the system by simplifying a system configuration and a system operation, or it is possible to improve cost performance by optimizing the system configuration.

Figure 5:
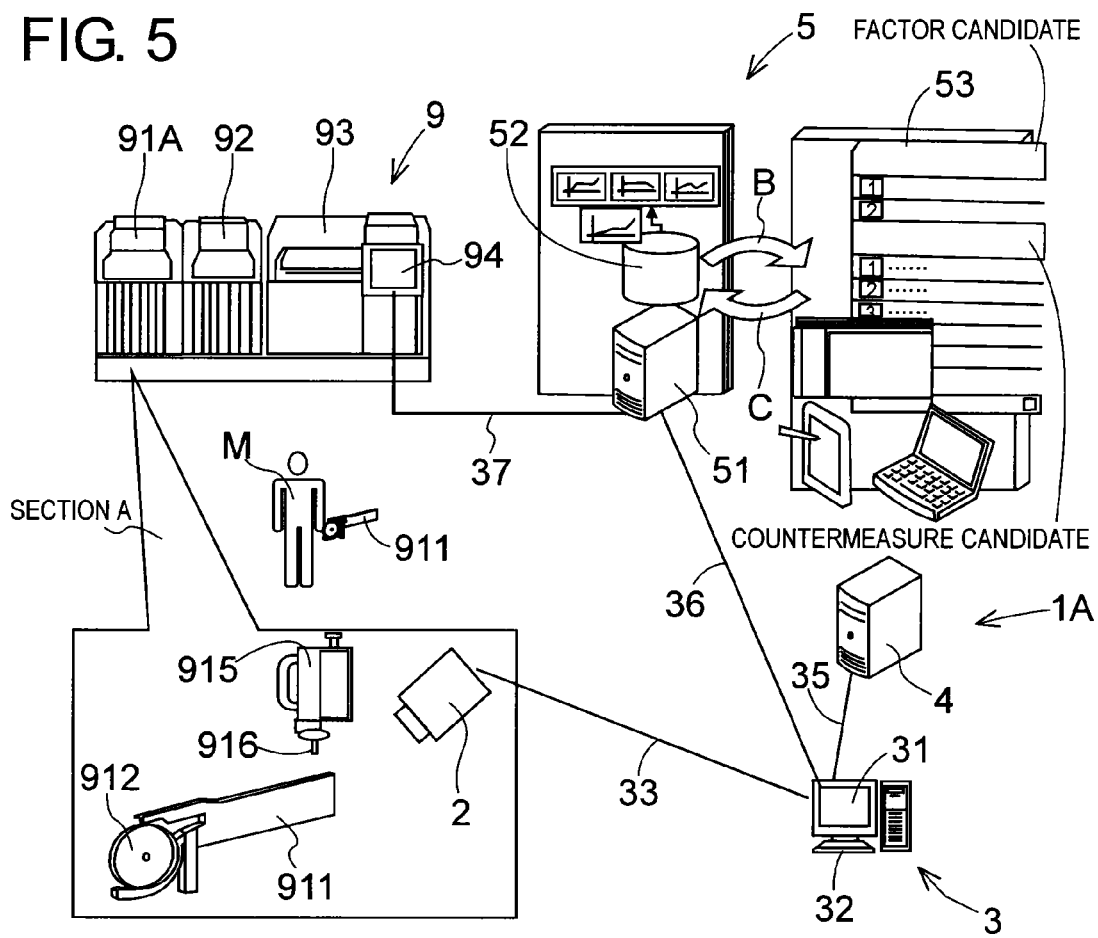
FIG. 5 is a configuration diagram illustrating a system configuration of a board production state monitoring system according to a second embodiment.

Next, a board production state monitoring system 1A according to a second embodiment will be described by mainly focusing on points different from those in the first embodiment. FIG. 5 is a configuration diagram illustrating a system configuration of the board production state monitoring system 1A according to the second embodiment. As illustrated, in the second embodiment, an in-process quality control system 5 (hereinafter, abbreviated as an IPQC system 5) is incorporated therein additionally. The board production state monitoring system 1A according to the second embodiment has all functions of the system 1 according to the first embodiment, and is provided with a function of the IPQC system 5.

The IPQC system 5 is a system for improving a function to prevent the working error from occurring. As illustrated in FIG. 5, the IPQC system 5 is configured to include a database server 51, a database unit 52, and various input/output devices 53. The database server 51 is a computer which manages the database unit 52, and performs various calculations, analyses, or inferences. The database server 51 is connected to the moving image storage computer 3 and the host computer 94 by communication lines 36 and 37, and can exchange data mutually. The database server 51 may be connected to the moving image storage computer 3 by way of the external storage memory 4.

The database server 51 acquires various data items indicating a work progress in addition to information related to a change factor, a sign of error occurrence, and a working error, from the host computer 94 in real time. Examples of the various data items can include component suction accuracy or component mounting accuracy. The database server 51 analyzes stability of these data items, and associates these data items with a location where the change factor is shown when the stability is lowered.

On the other hand, the database unit 52 holds a factor candidate, which is a candidate of a factor showing the sign of error occurrence, and a countermeasure candidate, which is a candidate of a countermeasure eliminating the factor candidate. Therefore, the database server 51 can infer the factor candidate and the countermeasure candidate of the sign of error occurrence by searching the database unit 52. As illustrated by a white arrow B in FIG. 5, the factor candidate and the countermeasure candidate which are inferred are output to and displayed on the input/output device 53, and then are provided for an operator M. This corresponds to a part of sign time display means according to the present invention.

The remaining part of the sign time display means according to the present invention is realized by software of the moving image storage computer 3. That is, if the trigger factor detection unit detects a sign of error occurrence, the sign time display means causes the data operation unit to display moving image data in units of a predetermined data length at the time when the sign of error occurrence is detected. An actual role of the sign time display means is to read the moving image data from the buffer memory or the external storage memory 4 if the moving image storage computer 3 receives information related to the sign of error occurrence from the host computer 94 by way of the database server 51, and is to display the moving image data on the display 31.

Figure 6:
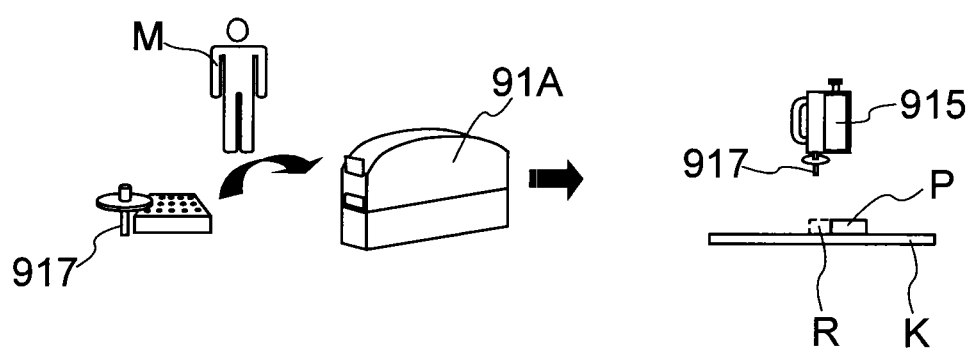
FIG. 6 is a diagram illustrating a case where inaccurate mounting is performed, which is an example of a sign of error occurrence, according to the second embodiment.

For example, FIG. 6 is a diagram illustrating a case where inaccurate mounting is performed, which is an example of the sign of error occurrence, according to the second embodiment. In FIG. 6, the operator M replaces the existing mounting nozzle with a mounting nozzle 917 so as to be set in a component mounting machine 91A, and a change factor is shown. Then, when the mounting nozzle 917 mounts a component P on a board K inside the component mounting machine 91A, the component P is deviated from an ideal position R, thereby causing inaccurate mounting. That is, the sign of error occurrence is shown.

At this time, the database server 51 associates the inaccurate mounting and the replacement of the mounting nozzle 917 with each other, and associates another factor candidate, if any, therewith. Furthermore, the database server 51 infers various countermeasure candidates for all factor candidates. On the other hand, the moving image storage computer 3 causes the display 31 to reproduce and display the image data of the work progress where the component P is mounted.

As described above, when the sign of error occurrence is shown, the operator M can find and take a desirable countermeasure by checking and comparing the factor candidate and the countermeasure candidate with the moving image data. Furthermore, the operator M can input content of the taken countermeasure by using the input/output device 53 as illustrated by a white arrow C in FIG. 5. In this manner, the database server 51 can output and display an advantageous effect of the content of the countermeasure to and on the input/output device 53 by analyzing a relationship between a changed state subsequent to the sign of error occurrence and the content of the taken countermeasure.

In the board production state monitoring system 1A according to the second embodiment, an advantageous effect which is the same as that according to the first embodiment is obtained, thereby further improving the function to prevent the working error from occurring. In other words, at the time when a minor sign of error occurrence is shown before the working error occurs, the operator M can take a desirable countermeasure by comparing the factor candidate and the countermeasure candidate with the moving image data. Therefore, the operator M can reliably prevent the working error from occurring before the sign of error occurrence results in the working error.

The change factor, the sign of error occurrence, and the working error are not limited to the above-described content, and may be other factors. In addition, in the first and second embodiments, the camera unit 2 is incorporated in the component mounting machines 91 and 91A, but the configuration is not limited thereto. For example, the camera unit 2 may monitor a solder printing progress by being incorporated in an ink jet apparatus or a solder printer employing a drawing method using a dispenser device. In addition, the present invention can be applied and modified in various ways.

REFERENCE SIGNS LIST 1, 1A: BOARD PRODUCTION STATE MONITORING SYSTEM
2: CAMERA UNIT
3: MOVING IMAGE STORAGE COMPUTER 4: EXTERNAL STORAGE MEMORY
5: IN-PROCESS QUALITY CONTROL SYSTEM (IPQC SYSTEM)
51: DATABASE SERVER 52: DATABASE UNIT
53: INPUT/OUTPUT DEVICE
9: BOARD PRODUCTION LINE
91, 91A: COMPONENT MOUNTING MACHINE
911: COMPONENT SUPPLY FEEDER 912: COMPONENT SUPPLY REEL
915: MOUNTING HEAD 916, 917: MOUNTING NOZZLE
92: BOARD APPEARANCE INSPECTION MACHINE
93: REFLOW MACHINE
94: HOST COMPUTER 99: COMMON BASE

The invention claimed is:

1. A board production state monitoring system comprising:
a camera unit that is disposed in a board work machine which carries out predetermined work for a board, that images a progress of the work by using a moving image, and that outputs moving image data;
a data operation unit that receives, stores, and displays the moving image data;
a trigger factor detection unit that detects at least one of a change factor in which working conditions of the work are changed inside the board work machine and a sign of error occurrence which shows that a working error may occur in the work, as a trigger factor;
imaging start means for causing the camera unit to start moving image capturing when the trigger factor detection unit detects the trigger factor, and for causing the data operation unit to temporarily store, in a buffer memory, the moving image data in units of a predetermined data length;

a working error detection unit that detects the working error;

data storage means for causing the data operation unit to store the moving image data in units of the predetermined data length, from the buffer memory to an external storage memory, at the time when the working error is detected by the working error detection unit; and imaging finish means for causing the camera unit to finish the moving image capturing and for causing the data operation unit to finish the temporary storage of the moving image data, after a predetermined time has elapsed from when the trigger factor detection unit detects the change factor, and after the sign of error occurrence which is detected by the trigger factor detection unit is no longer shown and the system restores a normal operation range, wherein a value of the working error is greater than a value of the trigger factor, and wherein a storage capacity of the external storage memory is greater than a storage capacity of the buffer memory.

2. The board production state monitoring system according to claim 1, further comprising:

error time display means for causing the data operation unit to display the moving image data in units of the predetermined data length at the time when the working error is detected by the working error detection unit.

3. The board production state monitoring system according to claim 1, further comprising:

a database unit that holds a factor candidate which is a factor candidate showing the sign of error occurrence, and a countermeasure candidate which is a countermeasure candidate eliminating the factor candidate; and sign time display means for causing the data operation unit to display the moving image data in units of the predetermined data length at the time when the sign of error occurrence is detected, when the trigger factor detection unit detects the sign of error occurrence, and for causing the database unit to display the factor candidate and the countermeasure candidate which are associated with the sign of error occurrence.

4. The board production state monitoring system according to claim 1, wherein the board work machine includes a component mounting machine including a board conveyance device which conveys a board into the component mounting machine along a conveyance passage, positions the board, and conveys the board out from the component mounting machine, a component supply device which has multiple component supply feeders equipped with a component supply reel for holding multiple components and supplies the component, and a component transfer device which has a mounting nozzle for sucking the component from the component supply device and mounting the component on the positioned board, and a mounting head moving by holding the mounting nozzle, wherein the camera unit is disposed in the component mounting machine, and outputs the moving image data by imaging at least one progress of the component suction and the component mounting of the mounting nozzle by using a moving image, wherein the change factor includes any one of a factor in which any one of the component supply feeder, the mounting nozzle, and the mounting head is changed, a factor in which a component lot is changed by replacing the component supply reel, and a factor in which a predetermined operation time has elapsed in at least any one device among the board conveyance device, the component supply device, and the component transfer device, and wherein the sign of error occurrence includes any one of inaccurate suction when the mounting nozzle sucks the component, and inaccurate mounting when the mounting nozzle mounts the component.

5. The board production state monitoring system according to claim 4, wherein the board work machine includes a board appearance inspection machine which inspects a position and a posture of the component mounted on the board, and wherein as the trigger factor detection unit, the board appearance inspection machine detects the sign of error occurrence which causes inaccurate mounting of the component, and as the working error detection unit, the board appearance inspection machine detects the working error which causes the component not to be mounted or causes a mounting accuracy error.

6. A board production state monitoring system comprising:

a camera unit that is disposed in a board work machine which carries out predetermined work for a board, that images a progress of the work by using a moving image, and that outputs moving image data; and circuitry configured to receive, store, and display the moving image data;

detect at least one of a change factor in which working conditions of the work are changed inside the board work machine and a sign of error occurrence which shows that a working error may occur in the work, as a trigger factor;

cause the camera unit to start moving image capturing when the trigger factor detection unit detects the trigger factor, and temporarily store, in a buffer memory, the moving image data in units of a predetermined data length; and detect the working error; and a data storage device which stores the moving image data in units of the predetermined data length at the time, from the buffer memory to an external storage memory, when the working error is detected, wherein a value of the working error is greater than a value of the trigger factor, wherein a storage capacity of the external storage memory is greater than a storage capacity of the buffer memory, and wherein the circuitry is further configured to cause the camera unit to finish the moving image capturing and finish the temporary storage of the moving image data, after a predetermined time has elapsed from when the change factor is detected, and after the sign of error occurrence which is detected is no longer shown and the system restores a normal operation range.

7. The board production state monitoring system according to claim 6, wherein the circuitry is further configured to display the moving image data in units of the predetermined data length at the time when the working error is detected.

8. The board production state monitoring system according to claim 6, further comprising:

a database unit that holds a factor candidate which is a factor candidate showing the sign of error occurrence, and a countermeasure candidate which is a countermeasure candidate eliminating the factor candidate; and a sign time display which displays the moving image data in units of the predetermined data length at the time when the sign of error occurrence is detected, when the sign of error occurrence is detected, and which causes the database unit to display the factor candidate and the countermeasure candidate which are associated with the sign of error occurrence.

9. The board production state monitoring system according to claim 6, wherein the board work machine includes a component mounting machine including a board conveyance device which conveys a board into the component mounting machine along a conveyance passage, positions the board, and conveys the board out from the component mounting machine, a component supply device which has multiple component supply feeders equipped with a component supply reel for holding multiple components and supplies the component, and a component transfer device which has a mounting nozzle for sucking the component from the component supply device and mounting the component on the positioned board, and a mounting head moving by holding the mounting nozzle, wherein the camera unit is disposed in the component mounting machine, and outputs the moving image data by imaging at least one progress of the component suction and the component mounting of the mounting nozzle by using a moving image, wherein the change factor includes any one of a factor in which any one of the component supply feeder, the mounting nozzle, and the mounting head is changed, a factor in which a component lot is changed by replacing the component supply reel, and a factor in which a predetermined operation time has elapsed in at least any one device among the board conveyance device, the component supply device, and the component transfer device, and wherein the sign of error occurrence includes any one of inaccurate suction when the mounting nozzle sucks the component, and inaccurate mounting when the mounting nozzle mounts the component.

10. The board production state monitoring system according to claim 9, wherein the board work machine includes a board appearance inspection machine which inspects a position and a posture of the component mounted on the board, and wherein the board appearance inspection machine detects the working error which causes the component not to be mounted or causes a mounting accuracy error.

* * * * *